(12) United States Patent
Ohno et al.

(10) Patent No.: US 8,318,585 B2
(45) Date of Patent: Nov. 27, 2012

(54) BONDING METHOD AND BONDING APPARATUS

(75) Inventors: Yasuhide Ohno, Kawasaki (JP); Keisuke Taniguchi, Kumamoto (JP); Tatsuya Takeuchi, Kobe (JP); Taizo Hagihara, Kobe (JP)

(73) Assignees: Shinko Seiki Company, Limited, Kobe-Shi, Hyogo (JP); Yasuhide Ohno, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/990,608

(22) PCT Filed: Apr. 30, 2009

(86) PCT No.: PCT/JP2009/058459
§ 371 (c)(1),
(2), (4) Date: Nov. 1, 2010

(87) PCT Pub. No.: WO2009/133919
PCT Pub. Date: Nov. 5, 2009

(65) Prior Publication Data
US 2011/0045653 A1    Feb. 24, 2011

(30) Foreign Application Priority Data
May 2, 2008    (JP) .................................. 2008-120291

(51) Int. Cl.
*H01L 21/30*    (2006.01)
*H01L 21/46*    (2006.01)

(52) U.S. Cl. ................. 438/455; 257/E21.482; 156/349

(58) Field of Classification Search .................. 438/455; 257/E21.482; 156/349
See application file for complete search history.

(56) References Cited

U.S. PATENT DOCUMENTS

| | | | |
|---|---|---|---|
| 2002/0185735 A1* | 12/2002 | Sakurai et al. | 257/737 |
| 2004/0072387 A1* | 4/2004 | Hong et al. | 438/108 |
| 2005/0121785 A1* | 6/2005 | Stelzl et al. | 257/738 |
| 2007/0141750 A1* | 6/2007 | Iwasaki et al. | 438/108 |
| 2007/0170227 A1 | 7/2007 | Ohno et al. | |

FOREIGN PATENT DOCUMENTS

| | | |
|---|---|---|
| JP | 2001-308144 | 2/2001 |
| JP | 2001-308144 A | 11/2001 |
| JP | 2005-230830 | 9/2005 |
| JP | 2007-266054 | 10/2007 |
| JP | 2008-041980 | 2/2008 |

OTHER PUBLICATIONS

International Search Report dated Jun. 23, 2009 for corresponding International Application No. PCT/JP2009/058459.
Office Action issued in corresponding Korean application No. 201007023927.
Office Action dated Jun. 2, 2011 issued in corresponding Singapore Application No. 201008071-1.

* cited by examiner

*Primary Examiner* — Alexander Ghyka
*Assistant Examiner* — Stanetta Isaac
(74) *Attorney, Agent, or Firm* — Duane Morris LLP

(57) ABSTRACT

To facilitate bonding of articles at a low temperature without degrading electrical contact between the articles.
An oxide film reducing treatment with hydrogen radicals is carried out for surfaces of lead-out electrodes (5) and bump electrodes (6) on the lead-out electrodes (5) of a semiconductor chip (2) and surfaces of lead-out electrodes (8) of an intermediate substrate (3), and, after that, the bump electrodes (6) of the semiconductor chip (2) and the lead-out electrodes (8) of the intermediate substrate (3) are aligned with each other. After that, a pressure is applied to bond the bump electrodes (6) and the lead-out electrodes (8).

5 Claims, 5 Drawing Sheets

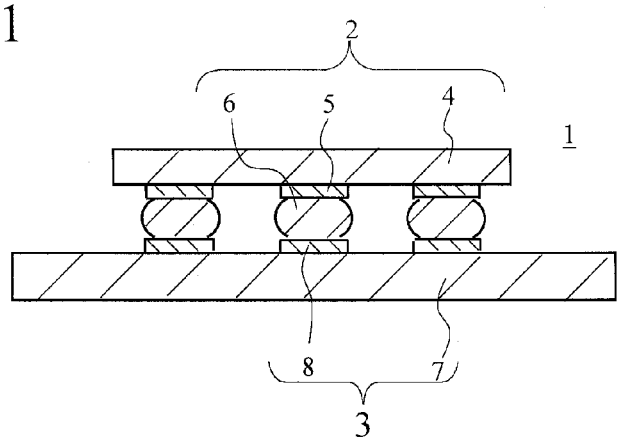
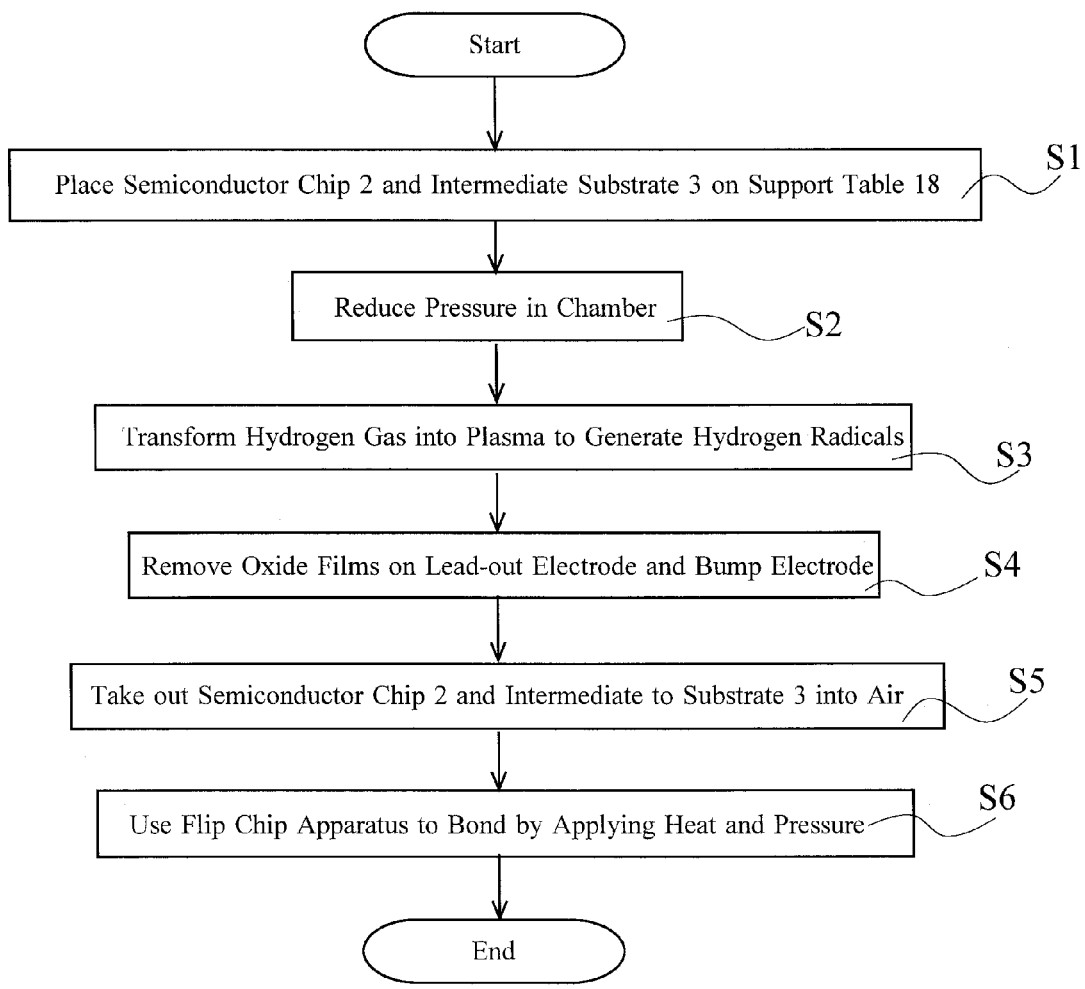

BONDING METHOD AND BONDING APPARATUS

TECHNICAL FIELD

This invention relates to a method of bonding substrates and an apparatus for use in the substrate bonding method.

BACKGROUND ART

One of technologies for bonding substrates is flip chip bonding. Flip chip is a system for bonding one substrate, i.e. a semiconductor chip, with another substrate (e.g. a printed circuit board or an interposer) through two-dimensionally arranged bump electrodes or bumps, without leading out lead lines from the one substrate. In other words, flip chip bonding is to bond bump electrodes on surfaces of the semiconductor chip and the other substrate, or to bond bump electrodes on a surface of one of the semiconductor chip and the other substrate to lead electrodes on the surface of the other.

Currently, it is usual to use flux in bonding bump electrodes to lead electrodes. Such flux is used to reduce and remove oxides on the surface of or within the bump electrodes and to prevent oxidation of the surfaces of the bump electrodes. However, flux remaining on the substrates after the bump electrodes are bonded to the lead electrodes will adversely affect the reliability of the semiconductor. In order to avoid such adverse effect, it is necessary to rinse out flux residues in a space between the semiconductor chip and the substrate so that there will be no flux remaining in the space.

However, it is expected that the space between a semiconductor chip and a substrate will be 50 μm or less in the future, and it will be very difficult to rinse out flux remaining in the space. It is also not easy to remove flux residue completely. Recently, many technologies for bonding bump electrodes to lead electrodes without resort to using flux are being proposed. For example, Patent Literature 1 discloses a technology in which an adhesive containing alcohol or organic acid as its principal ingredient is used to temporarily secure bump electrodes to lead electrodes, the bump electrodes are exposed to an atmosphere containing a free radical gas (hydrogen radicals) to reduce (i.e. remove) oxide films on the surfaces of the bump electrodes, and, then, a heat treatment is carried out to bond the bump electrodes to the lead electrodes.

Patent Literature 2 discloses a technology in which, after carrying out a treatment to reduce oxide films on the surfaces of electrodes, the electrodes are placed in position in the air, and they are melt in an oxygen-poor atmosphere.

Patent Literature 1: JP2005-230830A
Patent Literature 2: JP2007-266054A

DISCLOSURE OF INVENTION

Problem to be Solved by Invention

According to the technologies of Patent Literatures 1 and 2, the bump electrodes must be heated to a temperature above the melting temperature thereof by providing a heat treatment after the oxide film reducing treatment. However, such heating is undesirable to semiconductor chips.

The present invention has been made in consideration of this problem. An object of the present invention is to provide a bonding method and a bonding apparatus which make it possible to bond articles easily at a low temperature without degrading electrical contact between the articles.

Means to Solve Problem

A bonding method according to an embodiment of the present invention includes a step of carrying out an oxide film reducing treatment, using hydrogen radicals, for surfaces of articles to be bonded which are formed on surfaces of first and second substrates, and a step of aligning the articles to be bonded, which have been subjected to the oxide film reducing treatment, and, thereafter, applying a pressure to the first and second substrates to bond the articles to be bonded with each other. The article to be bonded on the first substrate may be an electrode on the surface of the first substrate. In such case, the article to be bonded on the second substrate is a bump electrode formed on an electrode on the surface of the second substrate, and the first and second substrates are taken out into the air after the oxide film reducing treatment, and the bonding by applying the pressure is carried out at a high temperature. Either of the aligning step and the heating step may precede the other. For example, when the articles to be bonded are of tin or a tin alloy, it is desirable for the temperature and time at and for which the electrodes are exposed to the air prior to the application of pressure to be within the following range.

$$\mathrm{Log}(t) \leq 3(1{,}000/T-2) \tag{1}$$

where "t" is an exposure time in minute, and "T" is a temperature in K at which the electrodes are heated. In case the heating is carried out along a heating curve with two or more steps therein as shown in FIG. 6, it is desirable for the exposure time and the heating temperature to fulfill the following condition.

$$\Sigma(\log(tn)/\{3(1000/Tn-2)\}) \leq 1 \tag{2}$$

where "tn" and "Tn" are the time and the temperature for the n-th step.

The articles to be bonded on the first and second substrates may be planar members disposed on the surfaces of the first and second substrates, or may be linear members on the surfaces of the first and second substrates.

A bonding apparatus according to another embodiment of the present invention includes means for carrying out an oxide film reducing treatment, using hydrogen radicals, for surfaces of articles to be bonded disposed on surfaces of first and second substrates, means for aligning the articles with each other after they have been subjected to the oxide film reducing treatment, and means applying pressure to the first and second substrates after the articles are aligned, to thereby bond the articles with each other.

Advantageous Effects of Invention

When bonding articles to be bonded by melting the articles by heating them, it is necessary to heat the articles to a temperature above the melting temperature of the article. However, heating of the articles to such a high temperature causes the surfaces of the articles to be oxidized, and, therefore, the articles cannot be bonded each other. It has been found that, by irradiating the surfaces of the articles with hydrogen radicals to remove oxide films on the surfaces by the use of the bonding method and apparatus of the present invention, the oxidation of the surfaces of the articles are retarded, and the articles are not oxidized and can be bonded with each other at a temperature lower than the melting temperature of the articles.

BRIEF DESCRIPTION OF DRAWINGS

FIG. 1 shows a semiconductor device 1 manufactured according to a first embodiment of the present invention.

FIG. 2 is a flow chart of a manufacturing method of the semiconductor device of FIG. 1.

BEST MODE FOR CARRYING OUT INVENTION

Figure 3:
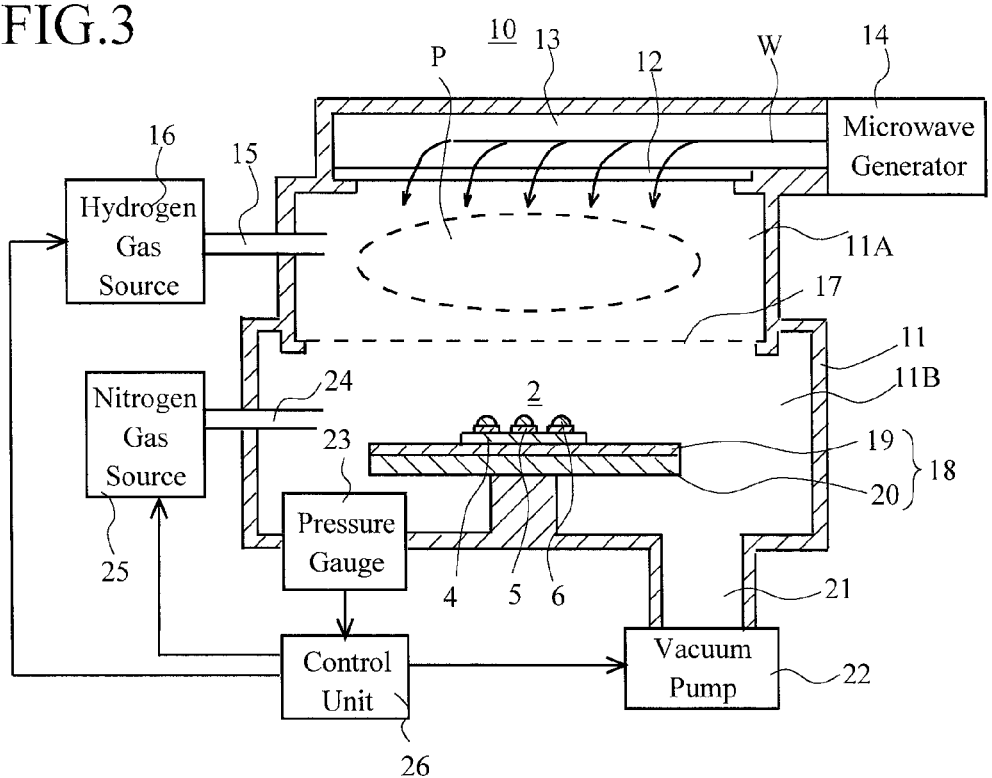
FIG. 3 shows an oxide film removing apparatus for use in manufacturing the semiconductor device of FIG. 1.

Hereinafter, some embodiments of the present invention are described in detail with reference to the drawings.

FIG. 1 shows a semiconductor device 1 manufactured according to a first embodiment of the present invention. FIG. 2 shows the flow of manufacturing of the semiconductor device 1 of FIG. 1. The semiconductor device 1 includes a first substrate, e.g. a semiconductor chip 2, bonded to a second substrate, e.g. an intermediate substrate 3.

The semiconductor chip 2 has a semiconductor element 4, lead-out electrodes 5, and bump electrodes 6. The semiconductor element 4 includes an integrated circuit (not shown), for example, built in it. The lead-out electrodes 5 are formed on a surface of the semiconductor element 4 and are connected to an end of the integrated circuit, for example. The bump electrodes 6 are disposed on surfaces of the lead-out electrodes 5.

The intermediate substrate 3 is an interposer, for example, for electrically bonding the lead-out electrodes 5 of the semiconductor chip 2 to electrode pads (not shown) disposed on a surface of a printed circuit board (not shown), and includes an insulating substrate 7, through-holes (not shown) extending through the insulating substrate 7, and lead-out electrodes 8 formed on a surface of the intermediate substrate 3 and connected to the through-holes. The printed circuit board is used to mount the semiconductor device 1 for particular use.

At least the surfaces of the lead-out electrodes 5 and 8 are made of a metal, including, for example, Al (aluminum), Ni (nickel), Cu (copper), Au (gold), Pd (palladium), Ag (silver), In (indium) and Sn (tin). The bump electrodes 6 are made of Sn (tin) containing no impurities, or tin containing at least one of impurities including, for example, Ag (silver), Cu (copper), Bi (bismuth), In (indium), Ni (nickel), Au (gold), P (phosphorus) and Pb (lead). The bump electrodes 6 are formed by, for example, plating, printing, ball bonding or vapor deposition.

Now, how the semiconductor device 1 is manufactured according to the embodiment of the present invention is described with reference to FIGS. 2 and 3.

First, an oxide film removing apparatus 10 for use in practicing the method for manufacturing the semiconductor device 1 is described.

The oxide film removing apparatus 10 is used to remove oxide films on the surfaces of the lead-out electrodes 5 and 8 and the bump electrodes 6. As shown in FIG. 3, the oxide film removing apparatus 10 has a chamber 11 including a plasma generating room 11A and a treatment room 11B, which are spatially separated from each other. A microwave generator 14 providing a microwave W is connected to the plasma generating room 11A via a waveguide 13 and a microwave introducing window 12, and, also, a hydrogen gas source 16 providing hydrogen gas is connected to the plasma generating room 11A via a supply tube 15. The plasma generating room 11A transforms the hydrogen gas supplied from the hydrogen gas source 16 into plasma by means of the microwave W generated in the microwave generator 14, to thereby generate hydrogen radicals (free radical gas).

The plasma generating room 11A is provided with a shield 17 on the treatment room 11B side of a plasma generating zone P in the plasma generating room 11a. The shield 17 is formed of, for example, metal netting and acts to collect as many unnecessary charged particles in the plasma as possible and also to lead the gas contained in the plasma generated in the plasma generating room 11A into the treatment room 11B. In this manner, the plasma generating room 11A introduces gas containing the hydrogen radicals into the treatment room 11B via the shield 17.

The treatment room 11B is provided with a support table 18 on which articles to be treated (e.g. the semiconductor chip 2 and the intermediate substrate 3) are placed. The support table 18 includes a heater 19 and a cooler 20 disposed at a location where the semiconductor chip 2 and the intermediate substrate 3 are to be placed. The heater 19 and the cooler 20 are arranged such that they can heat and cool the semiconductor chip 2 and the intermediate substrate 3 in a predetermined manner. The treatment room 11B is connected to a vacuum pump 22 via an exhaust port 21 disposed in the bottom of the treatment room 11B, and also a pressure gauge 23 is disposed on the bottom. The vacuum pump 22 exhausts the gas within the chamber 11 to reduce the pressure in the chamber 11, and the pressure gauge 23 measures the pressure in the chamber 11. A nitrogen gas source 25 is coupled via a supply tube 24 to the treatment room 11B. The nitrogen gas source 25 may be coupled to the plasma generating room 11A instead. The measurements taken by the pressure gauge 23 are sent to a control unit 26, which uses the measurements to control the hydrogen gas source 16, the vacuum pump 22 and the nitrogen gas source 25. In this way, the articles to be treated are exposed to the gas containing the hydrogen radicals.

(Removal of Oxide Film)

The above-described oxide film removing apparatus 10 is used to remove oxide films covering the surfaces of the lead-out electrodes 5 and 8 and the bump electrodes 6.

Specifically speaking, first the chamber 11 is opened, and the semiconductor chip 2 and the intermediate substrate 3 are disposed on the support table 18, with the lead-out electrodes 5 and 8 and the bump electrodes 6 facing upward (Step S1). It should be noted that FIG. 3 shows an example in which the semiconductor chip 2 is placed on the support table 18. Next, the chamber 11 is closed, and the vacuum pump 22 is activated to exhaust the gas within the chamber 11 so as to reduce the pressure in the chamber 11 (Step S2).

Next, the microwave generator 14 is operated to generate the microwave W, and at the same time, the hydrogen gas source 16 is operated to provide hydrogen gas. This causes the hydrogen gas to be transformed into the plasma form by the microwave W, whereby hydrogen radicals (free radical gas) are generated (Step S3). As a result, the hydrogen radicals generated in the plasma generating room 11A are carried on the gas stream and pass through the shield 17 into the treatment room 11B.

The lead-out electrodes 5 and 8 and the bump electrodes 6 of the semiconductor chip 2 and the intermediate substrate 3 resting on the support table 18 are exposed to the gas containing the hydrogen radicals supplied through the shield 17. This causes the oxide films over the surfaces of the lead-out electrodes 5 and 8 and over the surfaces of the bump electrodes 6 to chemically react with the hydrogen radicals and evaporate, and, thus, the oxide films are removed from the surfaces (Step S4).

(Aligning and Bonding)

Next, the semiconductor chip 2 and the intermediate substrate 3 are taken out into the atmosphere (Step S5), and, after that, they are bonded in a flip chip bonding machine (Step S6). The temperature and time of exposure, to the atmosphere, of the surfaces to be bonded prior to the application of pressure are as follows.

$$\text{Log}(t) \leq 3(1,000/T-2) \quad (1)$$

where "t" is an exposure time in minute, and "T" is a heating temperature in K.

When solder is heated to a high temperature, its surface is oxidized, making the bonding impossible. The inventors have found that such oxidation can be delayed by surface oxide film reducing treatment, and, in particular, by irradiating the surface with hydrogen radicals to remove the oxide film, whereby the bonding can be done in the temperature and exposure time ranges expressed by the expression (1), without causing oxidation. It has been also found that, solid-phase bonding of solder is possible by applying a pressure of from 1 MPa to 6 MPa at a temperature of from 100° C. to 200° C., provided that no oxide films are present on the surface of the solder. A temperature equal to or lower than 100° C. provides insufficient mutual diffusion, and at a temperature equal to or higher than 200° C., the solder is softened to an excessive extent. A pressure to be applied need be at least 1 MPa to remove unevenness in the surfaces to be bonded together, but a pressure equal to or larger than 6 MPa collapses the bumps. By applying an ultrasonic wave when bonding is being carried out, the bonding strength is further increased.

Now, how the expression (1) has been obtained is briefly described. Balls (having a diameter of 760 μm) of solder composed of Sn, and Ag in an amount of 3.5% were subjected to a surface oxide film reduction by the use of a hydrogen radical treatment to completely remove the oxide films, and, after that, the solder balls were placed on a hot plate and heated at a constant heating temperature (T) for a given time (t) in the air, and, after that, cooled down. The thickness of the surface oxide films were measured by Auger analysis. It has been found that, keeping the solder balls at a constant temperature, the oxide film thickness does not increase for a certain time, but when the time according to that temperature lapses, the thickness increases abruptly. Expression (1) has been obtained to show the relationship between the temperature (T) and the time (t) after which the thickness of the oxide film starts increasing. Further, it has been confirmed by experiments that, when the heating is carried out in two or more steps, the time until which the oxide film thickness starts increasing is determined by the sum of times until which the oxide film thickness starts increasing in respective ones of the plural steps.

By carrying out the oxide film reducing treatment, almost no oxide film was present before the lapse of the heating time after that the oxide film thickness would start increasing abruptly, and, therefore, even if the solder was heated in the air, successful bonding resulted. If such oxide film reducing treatment were not carried out, oxide films would grow at a temperature lower than the above-discussed temperature and in a shorter time.

Table 1 shows a plurality of combinations (Materials A1-A33) of various materials (Sn, Ag, Cu, Bi, In, Ni, Au, P and Pb) which may be possibly used as the materials for the bump electrodes 6. The values appearing in Table 1 are contents by percentage (%), and the "Rest" in the column for Sn means the value resulting from subtracting the sum of the contents by percentage of the elements in each of the combinations from the total of 100. Materials B1 and B2 in Table 1 are materials which contain Zn (zinc), and therefore their oxide films contain a larger percentage of ZnO. Accordingly, they are materials of which oxide films are difficult to chemically remove in comparison with SnO, and are not suitable as materials of the bump electrodes 6 of the present embodiment. This is the reason why they are shown as comparative examples.

TABLE 1

| | Ag | Cu | Zn | Bi | In | Ni | Au | P | Pb | Sn |
|---|---|---|---|---|---|---|---|---|---|---|
| Material A1 | 0.39 | 0.5 | — | — | — | — | — | — | — | Rest |
| Material A2 | 0.79 | 0.5 | — | — | — | — | — | — | — | Rest |
| Material A3 | 1.21 | 0.5 | — | — | — | — | — | — | — | Rest |
| Material A4 | 1.82 | 0.5 | — | — | — | — | — | — | — | Rest |
| Material A5 | 2.22 | 0.5 | — | — | — | — | — | — | — | Rest |
| Material A6 | 2.75 | 0.5 | — | — | — | — | — | — | — | Rest |
| Material A7 | 3 | 0.5 | — | — | — | — | — | — | — | Rest |
| Material A8 | 3.44 | 0.5 | — | — | — | — | — | — | — | Rest |
| Material A9 | 3.9 | 0.5 | — | — | — | — | — | — | — | Rest |
| Material A10 | — | — | — | — | — | — | — | — | 3 | Rest |
| Material A11 | — | — | — | — | — | — | — | — | 5 | Rest |
| Material A12 | — | — | — | — | — | — | — | — | 10 | Rest |
| Material A13 | — | — | — | — | — | — | — | — | 37 | Rest |
| Material A14 | — | — | — | — | — | — | — | $5 \times 10^{-4}$ | 37 | Rest |
| Material A15 | — | — | — | — | — | — | — | — | 40 | Rest |
| Material A16 | 2 | — | — | — | — | — | — | — | 36 | Rest |
| Material A17 | 2 | — | — | — | — | — | — | — | — | Rest |
| Material A18 | 3 | — | — | — | — | — | — | — | — | Rest |
| Material A19 | 3.5 | — | — | — | — | — | — | — | — | Rest |
| Material A20 | — | 0.7 | — | — | — | — | — | — | — | Rest |
| Material A21 | 1.2 | 0.5 | — | — | — | 0.05 | — | — | — | Rest |
| Material A22 | — | — | — | — | 42 | — | — | — | — | Rest |
| Material A23 | — | — | — | — | 5 | — | — | — | — | Rest |
| Material A24 | — | — | — | — | 50 | — | — | — | — | Rest |
| Material A25 | — | — | — | — | — | — | 0.005 | — | — | Rest |
| Material A26 | — | — | — | — | — | — | 10 | — | — | Rest |
| Material A27 | — | — | — | — | — | — | 79 | — | — | Rest |
| Material A28 | — | — | — | — | — | — | 80 | — | — | Rest |
| Material A29 | — | — | — | — | — | — | — | — | 100 | |
| Material A30 | 2.5 | 0.8 | — | — | — | — | — | — | — | Rest |
| Material A31 | 3.8 | 0.7 | — | — | — | — | — | — | — | Rest |
| Material A32 | 3.5 | 0.7 | — | — | — | — | — | — | — | Rest |
| Material A33 | 2 | 0.5 | — | 3 | — | — | — | — | — | Rest |
| Material B1 | — | — | 9 | — | — | — | — | — | — | Rest |
| Material B2 | — | — | 8 | 3 | — | — | — | — | — | Rest |

Table 2 shows die shearing strength resulting from using the above-described Materials A1-A33 and B1-B2 as the materials of the bump electrodes 6, using Cu (Material C1) and Au (Material C2) as a material of the lead-out electrodes 5 and 8, carrying out an oxide film reducing treatment, as a chemical treatment, with one of hydrogen radicals, a mixture of hydrogen and Ar gas, an evaporated gas of organic acid including formic acid, and hydrogen and nitrogen gases, and changing the bonding temperature (heating temperature T), the bonding pressure, and the heating time period (the time period t for which the articles are exposed to the air at the heating temperature before the pressure is exerted). In Table 2, a circle means that the die shearing strength after bonding is 2 MPa or larger, a triangle means that the die shearing strength after bonding is smaller than 2 MPa and equal to or larger than 0.5 MPa, and a cross (x) means that the die shearing strength after bonding is smaller than 0.5 MPa. The heating temperatures and the heating time periods of the cases indicated by a circle and a triangle fulfill the previously described Expression (1).

TABLE 2

| No. | Bump Electrode | Lead-out Electrode | Chemical Treatment | Bonding Temperature | Bonding Pressure | Heating Time | Die Shearing Strength |
|---|---|---|---|---|---|---|---|
| 1-33 | A1-A33 | Cu | Hydrogen Radicals | 150° C. | 2 MPa | 1 min. | ○ (A1-A33) |
| 34 | A18 | Cu | Hydrogen Radicals | 200° C. | 1 MPa | 0.5 min. | ○ |
| 35 | A18 | Au | Hydrogen Radicals | 170° C. | 2 MPa | 2 min. | ○ |
| 36 | A18 | Au | Gas Mixture of Hydrogen and Ar | 170° C. | 2 MPa | 2 min. | ○ |
| 37 | A18 | Au | Gas of Evaporated Organic Acid including Formic Acid | 170° C. | 2 MPa | 2 min. | ○ |
| 38 | A18 | Cu | Hydrogen Radicals | 130° C. | 4 MPa | 10 min. | ○ |
| 39-40 | B1, B2 | Cu | Hydrogen Radicals | 170° C. | 2 MPa | 2 min. | X |
| 41 | A18 | Cu | Hydrogen Radicals | 90° C. | 2 MPa | 50 min. | X |
| 42 | A18 | Au | Not Done | 170° C. | 2 MPa | 2 min. | X |
| 43 | A18 | Au | Hydrogen Radicals | 170° C. | 0.5 MPa | 2 min. | Δ |
| 44 | A9 | Cu | Hydrogen Radicals | 170° C. | 6 MPa | 5 min. | ○ |
| 45 | A9 | Cu | Hydrogen Radicals | 100° C. | 4 MPa | 10 min. | ○ |
| 46 | A9 | Cu | Hydrogen Radicals | 150° C. | 3 MPa | 9 min. | ○ |
| 47 | A18 | Au | Hydrogen Gas | 170° C. | 2 MPa | 2 min. | ○ |
| 48 | A18 | Au | Mixture Gas of Hydrogen and N2 | 170° C. | 2 MPa | 2 min. | ○ |
| 49 | A18 | Au | Hydrogen Radicals | Two-Step Heating | 3 MPa | Two-Step Heating | ○ |
| 50 | A9 | Au | Hydrogen Radicals | Two-Step Heating | 4 MPa | Two-Step Heating | ○ |

Two-step heating includes a step of heating at 150° C. for 2 minutes followed by a step of heating at 170° C. for 2 minutes.

Remarks:

Semiconductor chips with 4,000 bump electrodes having a diameter of 50 μm were bonded to substrates with lead-out electrodes of the same shape.

The Heating Time is a time period for which the articles are exposed to the air at the heating temperature before the pressure is exerted. For No. 35, ultrasonic wave was additionally applied.

No. 1-No. 38 and No. 44-No. 50 were examples of the present invention.

No. 39-No. 43 were comparative examples.

As illustrated above, according to the process for manufacturing a semiconductor device 1 according to the present embodiment, flip chip bonding with high bonding strength is readily available without degrading electrical contact between the bump electrodes 6 and the lead-out electrodes 8.

In the described embodiment, the bump electrodes 6 and the lead-out electrodes 8 are bonded together, but the bump electrodes and other bump electrodes may be bonded. Also, in the described embodiment, the semiconductor chip 2 and the intermediate substrate 3 are bonded, but the semiconductor chip 2 and a printed circuit board may be bonded to each other.

Figure 4:
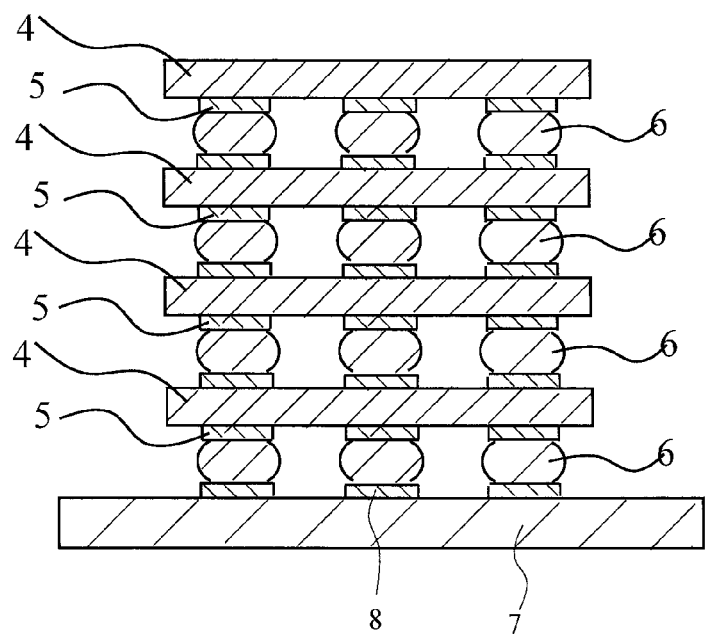
FIG. 4 shows another semiconductor device which can be manufactured according to the first embodiment of the present invention.
Figure 5:
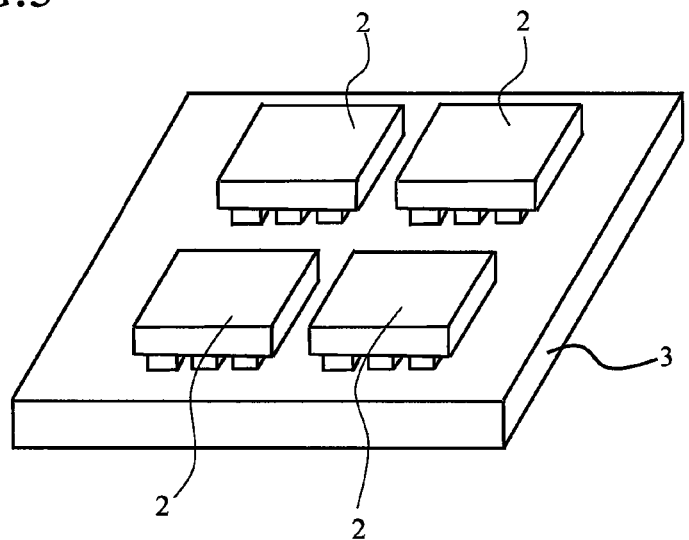
FIG. 5 shows still another semiconductor device which can be manufactured according to the first embodiment of the present invention.
Figure 6:
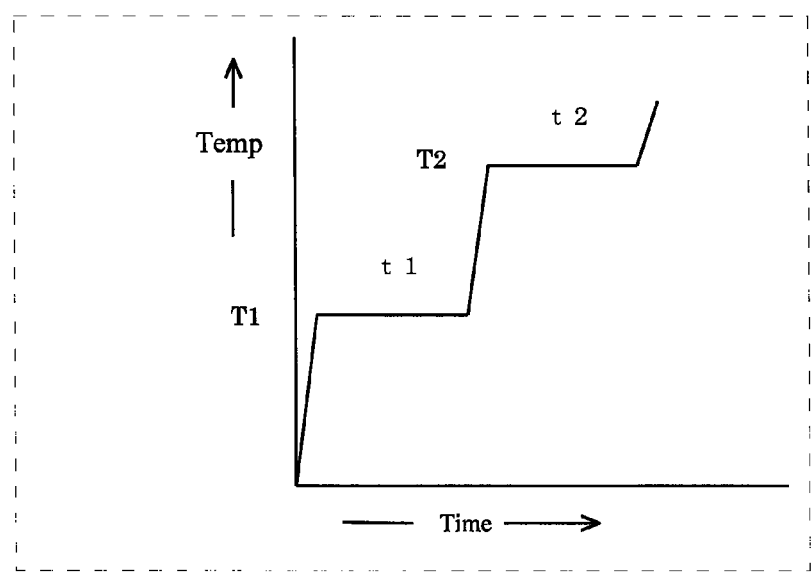
FIG. 6 shows a temperature-time relationship in a modification of the first embodiment of the present invention.

The embodiment has been described with reference to flip chip bonding of one semiconductor chip 2 and the intermediate substrate 3 by way of example, but the present invention is not limited to such example. Instead, the present invention is applicable also to a semiconductor device like the one shown in FIG. 4 in which semiconductor chips each having a lead-out electrode 5, also on the upper surface of a semiconductor element 4, are disposed between the semiconductor chip 2 and the intermediate substrate 3. The semiconductor element including the semiconductor chip 2 and one or a plurality of semiconductor chips is an example of the "first substrate" of the present invention. The present invention can be also embodied in a semiconductor device having a plurality of semiconductor chips 2 disposed on the intermediate substrate as shown in FIG. 5, for example. In this case, a plurality of semiconductor chips 2 are an example of the "first substrate".

Figure 7:
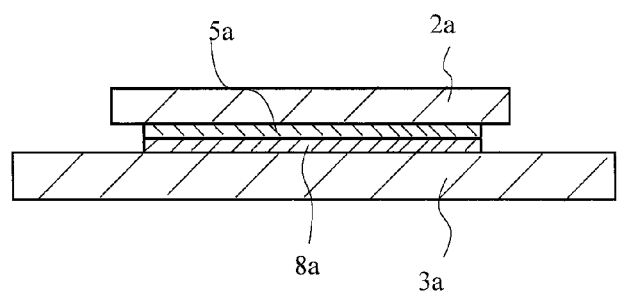
FIG. 7 shows substrates manufactured according to a second embodiment of the present invention.
Figure 8:
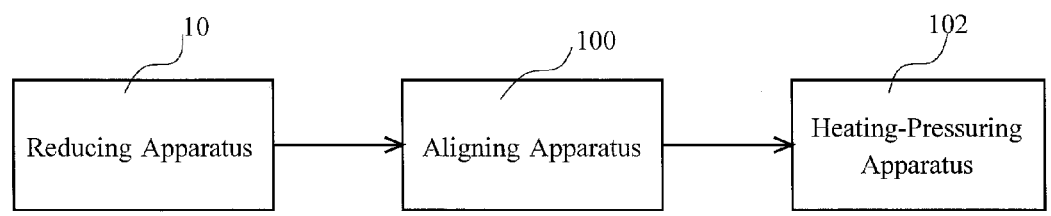
FIG. 8 shows a bonding apparatus for use in manufacturing the substrates of FIG. 7.
Figure 9:
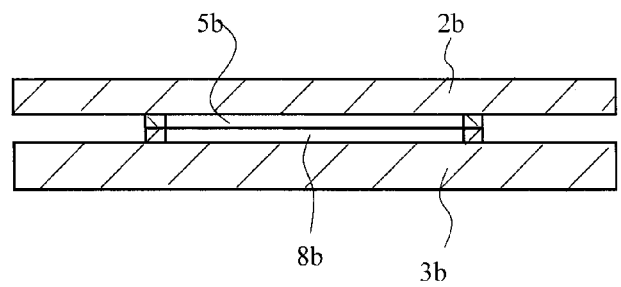
FIG. 9 shows substrates manufactured according to a third embodiment of the present invention.

A bonding method according to a second embodiment of the present invention is for bonding planar members, e.g. copper films 5*a* and 8*a*, formed respectively on a first substrate 2*a* and a second substrate 3*a*, as shown in FIG. 7. As shown in FIG. 8, as in the first embodiment, the bonding is carried out by using the oxide film removing apparatus 10 to carry out a treatment to reduce oxide films on the films 5*a* and 8*a*, then, removing the first and second substrates 2*a* and 3*a* out of the oxide film removing apparatus 10, and using a known aligning apparatus 100 to align the first and second substrates 2*a* and 3*a* such that the films 5*a* and 8*a* are aligned with each other, and, after that, using a heating and pressuring apparatus 102 to heat and pressure them at a temperature lower than the melting point of copper (i.e. 1,085° C.), whereby the films 5*a* and 8*a* are bonded to each other.

For example, when the films 5a and 8a were heated to 150° C. and applied with a pressure of 0.3 MPa, the films 5a and 8a were not bonded together, but, when they were heated at 250° C. and applied with a pressure of 0.3 MPa, the films 5a and 8a were bonded to each other. It should be noted that, even when the films 5a and 8a were heated and pressured after being left in the air for 60 seconds following the oxide film reducing treatment, the films 5a and 8a were successfully bonded together.

The bonding method according to a third embodiment of the present invention is for bonding linear members, e.g. narrow frameworks 5b and 8b of tin-indium solder having a melting point of 120° C. formed respectively on a first substrate 2b and a second substrate 3b, to thereby seal off the frames 5b and 8b. As shown in FIG. 8, as in the first embodiment, the bonding is carried out by using the oxide film removing apparatus 10 to carry out an oxide film reducing treatment for the frames 5b and 8b, then, removing the first and second substrates 2b and 3b out of the oxide film removing apparatus 10, using the known aligning apparatus 100 to align the first and second substrates 2b and 3b such that the frames 5b and 8b are aligned with each other, and, after that, using the heating and pressuring apparatus 102 to heat and apply pressure to them at a temperature lower than their melting point, which results in the bonding of the frames 5b and 8b.

For example, when the frames 5b and 8b were heated at 50° C. with a pressure of 30 MPa being applied, the frames 5b and 8b were not bonded together, but, when the frames 5b and 8b were heated at 80° C. with a pressure of 15 MPa being applied, heated at 80° C. with a pressure of 30 MPa being applied, heated at 100° C. with a pressure of 15 MPa being applied, and heated at 100° C. with a pressure of 30 MPa being applied, the frames 5b and 8b were bonded together. The frames 5b and 8b were successfully bonded by heating and pressuring them even after they were left in the air for 60 minutes.

It has been found, from the above-described experiments, that, for metals, excluding tin and tin alloys, of the films 5a and 8a and the frames 5b and 8b, as used in the second and third embodiments, the temperature and time of the environments to which the films 5a and 8a and the frames 5b and 8b are exposed after the oxide film reducing treatment and before the heating and application of pressure, desirably fulfill the following condition.

$$\mathrm{Log}(t) \leq 3(1{,}000/T{-}3) \qquad (3)$$

where "t" is an exposure time in minute, and "T" is a heating temperature in K. This Expression (3) has been derived by the same process as for Expressions (1) and (2).

Figure 10:
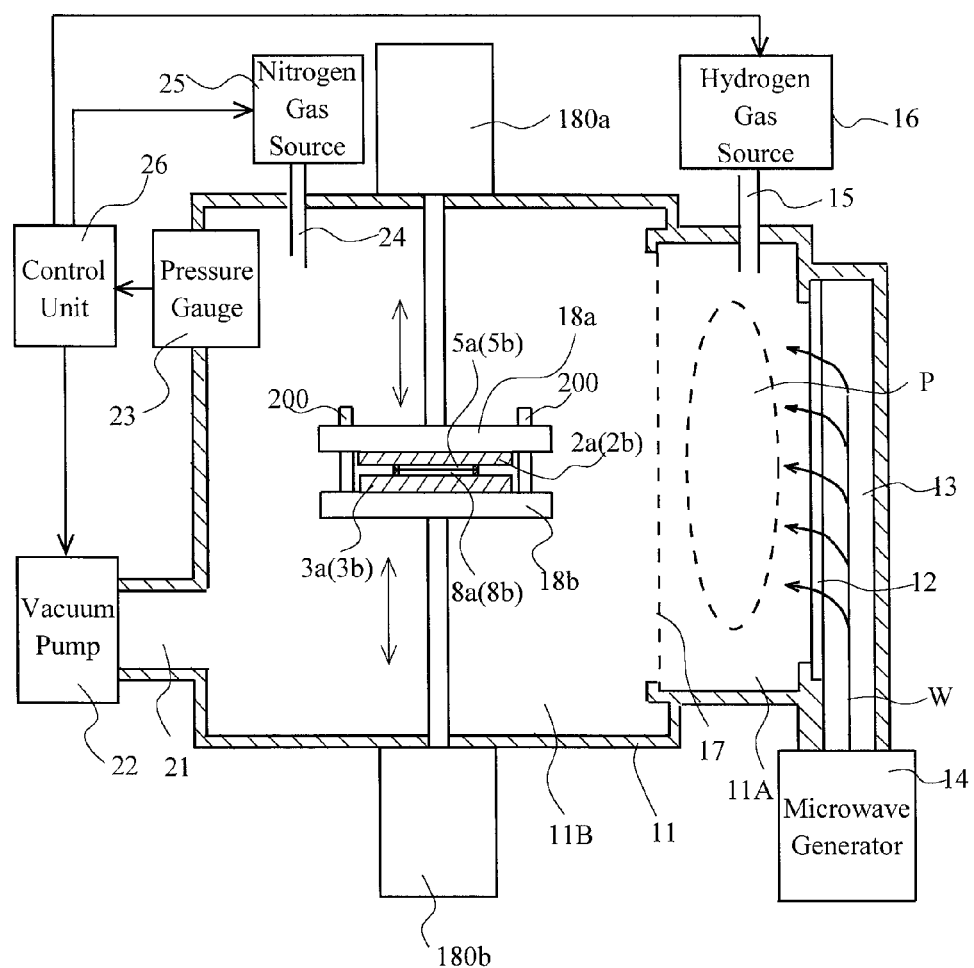
FIG. 10 shows another bonding apparatus for use in manufacturing the substrates of FIGS. 7 and 9.

In the second and third embodiments, the aligning apparatus 100 and the bonding apparatus 102 are separate apparatuses, but a bonding apparatus provided with an aligning apparatus may be used instead. Also, as shown in FIG. 10, a single bonding apparatus, which also functions as an oxide film removing apparatus, an aligning apparatus and a heating and pressuring apparatus may be used.

In this bonding apparatus, the oxide film removing apparatus 10 shown in FIG. 3 is shown being rotated by 90 degrees. The same reference numerals and symbols of the oxide film removing apparatus 10 as used in FIG. 3 are attached to the equivalent components, and their description is not given.

In the treatment room 11B, a support table 18a for placing a first substrate 2a or 2b thereon, and a support table 18b for placing a second substrate 3a or 3b thereon, are disposed. Like the support table 18 of the oxide film removing apparatus 10, the support table 18a is provided with a heater and a cooler, which are not shown, in a portion where the first substrate 2a or 2b is to be placed. Also, the support table 18b is provided with a heater and a cooler, which are not shown, in a portion where the second substrate 3a or 3b is to be placed. These support tables 18a and 18b are coupled respectively to elevators 180a and 180b, which are disposed outside the treatment room 11B, whereby the support tables 18a and 18b can be raised and lowered as indicated by arrows. With the support table 18a lowered and the support table 18b raised, pressure is applied to the film 5a or the film 8a of the first substrate 2a or 2b on the support table 18a and to the frame 5b or the frame 8b of the second substrate 3a or 3b on the support table 18b, to thereby bond them together. While the pressure is being applied, the heater heats the films 5a and 8a or the frames 5b and 8b to a temperature lower than the melting temperature of the films 5a and 8a or the frames 5b and 8b. Further, the support table 18b is provided with pins 200 for use in aligning the first substrate 2a or 2b with the second substrate 3a or 3b, and holes (not shown) through which the pins 200 can pass are formed in the support table 18a. The pins 200 and the holes function as the aligning apparatus.

The invention claimed is:

1. A bonding method comprising:
    a step of placing in a chamber first and second substrates respectively having, on surfaces thereof, first and second articles to be bonded, and carrying out a reducing treatment for surfaces of said first and second articles with hydrogen radicals generated in said chamber to thereby remove oxide films present on said first and second articles; and
    a step of taking out said first and second substrates from said chamber, aligning said first and second articles with each other outside said chamber, and, thereafter, applying a pressure to said first and second substrates to bond said first and second articles.

2. The bonding method according to claim 1, wherein said first article is an electrode disposed on the surface of said first substrate; and said second article is a bump electrode disposed on the surface of said second substrate; said step of bonding said first and second articles by applying a pressure is carried out at a raised temperature.

3. The bonding method according to claim 2, wherein an exposure time t (min.) after said first and second substrates are taken out of said chamber before said bonding by applying a pressure is carried out, and a temperature T (K) at which said first and second substrates are kept during said exposure time are within the ranges determined by an expression, Log(t)≦3 (1,000/T−2).

4. The bonding method according to claim 1, wherein said first and second articles to be bonded are planar members disposed on said first and second substrates.

5. The bonding method according to claim 1, wherein said first and second article to be bonded are linear members disposed on said first and second substrates.

* * * * *

UNITED STATES PATENT AND TRADEMARK OFFICE
CERTIFICATE OF CORRECTION

PATENT NO. : 8,318,585 B2
APPLICATION NO. : 12/990608
DATED : November 27, 2012
INVENTOR(S) : Yasuhide Ohno et al.

It is certified that error appears in the above-identified patent and that said Letters Patent is hereby corrected as shown below:

Column 10, line 59, delete "article" and insert therefor --articles--

Signed and Sealed this
Twelfth Day of February, 2013

Teresa Stanek Rea
*Acting Director of the United States Patent and Trademark Office*